(12) United States Patent
Den Boef et al.

(10) Patent No.: US 8,319,968 B2
(45) Date of Patent: Nov. 27, 2012

(54) IMPRINT LITHOGRAPHY

(75) Inventors: Arie Jeffrey Den Boef, Waalre (NL); Andre Bernardus Jeunink, Bergeyk (NL); Johannes Petrus Martinus Bernardus Vermeulen, Helmond (NL); Pascal Antonius Smits, Geertruidenberg (NL); Sander Frederik Wuister, Eindhoven (NL); Yvonne Wendela Kruijt-Stegeman, Eindhoven (NL); Catharinus De Schiffart, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 502 days.

(21) Appl. No.: 12/556,818

(22) Filed: Sep. 10, 2009

(65) Prior Publication Data

US 2010/0065987 A1    Mar. 18, 2010

Related U.S. Application Data

(60) Provisional application No. 61/136,518, filed on Sep. 11, 2008.

(51) Int. Cl.
*G01B 11/00* (2006.01)

(52) U.S. Cl. ........ 356/401; 356/456; 264/408; 425/150; 425/385

(58) Field of Classification Search .................. 356/401, 356/456; 425/150, 385; 216/40.1, 41, 129; 264/408
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,084,673 A * | 7/2000 | Van Den Brink et al. | 356/492 |
| 6,180,239 B1 | 1/2001 | Whitesides et al. | |
| 6,334,960 B1 | 1/2002 | Willson et al. | |
| 6,982,793 B1 | 1/2006 | Yang et al. | |
| 7,046,361 B1 | 5/2006 | Yang et al. | |
| 7,070,405 B2 | 7/2006 | Sreenivasan et al. | |
| 7,517,211 B2 | 4/2009 | Kruijt-Stegeman et al. | |
| 7,619,816 B2 * | 11/2009 | Deng et al. | 359/484.01 |
| 7,815,424 B2 | 10/2010 | Nakamura et al. | |
| 7,828,984 B2 | 11/2010 | Seki et al. | |

(Continued)

FOREIGN PATENT DOCUMENTS

EP    1669802    6/2006

(Continued)

OTHER PUBLICATIONS

Haisma, J., et al., "Mold-assisted nanolithography: A process for reliable pattern replication", J. Vac. Sci. Technol. B. vol. 14, No. 6, Nov./Dec. 1996.

(Continued)

*Primary Examiner* — Gregory J Toatley
*Assistant Examiner* — Iyabo S Alli
(74) *Attorney, Agent, or Firm* — Pillsbury Winthrop Shaw Pittman LLP (57) ABSTRACT

A method of determining a position of a substrate relative to an imprint template is described, wherein the imprint template has at least three gratings and the substrate has at least three gratings positioned such that each imprint template grating forms a composite grating with an associated substrate grating, the at least three imprint template gratings and associated substrate gratings having offsets relative to one another. The method includes detecting an intensity of radiation which is reflected by the three composite gratings, and using the detected intensities to determine displacement of the substrate or imprint template from a position.

20 Claims, 6 Drawing Sheets

U.S. PATENT DOCUMENTS

| | | |
|---|---|---|
| 2004/0022888 A1 | 2/2004 | Sreenivasan et al. |
| 2004/0124566 A1 | 7/2004 | Sreenivasan et al. |
| 2005/0274693 A1 | 12/2005 | Heidari et al. |
| 2006/0007440 A1 | 1/2006 | Kuroda et al. |
| 2006/0157444 A1 | 7/2006 | Nakamura et al. |
| 2006/0267231 A1 | 11/2006 | Van Santen et al. |
| 2007/0141191 A1 | 6/2007 | Kruijt-Stegeman et al. |
| 2007/0145639 A1 | 6/2007 | Seki et al. |
| 2007/0200276 A1 | 8/2007 | Mackey et al. |
| 2007/0229785 A1 | 10/2007 | Den Boef et al. |
| 2009/0176167 A1 | 7/2009 | Hulsebos et al. |
| 2010/0148397 A1 | 6/2010 | Nakamura et al. |
| 2011/0042348 A1 | 2/2011 | Seki et al. |

FOREIGN PATENT DOCUMENTS

| | | |
|---|---|---|
| JP | 62-190725 | 8/1987 |
| JP | 2-090006 | 3/1990 |
| JP | 2006-165371 | 6/2006 |
| JP | 2006-516065 | 6/2006 |
| JP | 2007-137051 | 6/2007 |
| JP | 2007-173614 | 7/2007 |
| JP | 2007-227890 | 9/2007 |
| JP | 2009-177159 | 8/2009 |
| WO | WO 02/067055 A2 | 8/2002 |
| WO | 2007/040855 | 4/2007 |

OTHER PUBLICATIONS

Japanese Office Action mailed Sep. 26, 2011 in corresponding Japanese Patent Application No. 2009-204211.

Japanese Office Action mailed Sep. 21, 2012 in corresponding Japanese Patent Application No. 2009-204211.

* cited by examiner

IMPRINT LITHOGRAPHY

This application claims priority and benefit under 35 U.S.C. §119(e) to U.S. Provisional Patent Application No. 61/136,518, entitled "Imprint Lithography", filed on Sep. 11, 2008. The content of that application is incorporated herein in its entirety by reference.

FIELD

The present invention relates to imprint lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) radiation lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the wavelength of a radiation source or the numerical aperture of a projection system. Instead, the resolution is mainly limited to the pattern density on the imprint template.

Lithography typically involves applying several patterns onto a substrate, the patterns being stacked on top of one another such that together they form a device such as an integrated circuit. Alignment of each pattern with a previously provided pattern is a significant consideration. If patterns are not aligned with each other sufficiently accurately, then this may result in some electrical connections between layers not being made. This, in turn, may cause the device to be non-functional. Lithographic apparatus therefore usually include an alignment apparatus which is intended to align each pattern with a previously provided pattern.

SUMMARY

Accordingly, it is advantageous, for example, to provide an imprint lithography alignment apparatus and method which is novel and inventive.

According to an aspect of the invention, there is provided a method of determining a position of a substrate relative to an imprint template, the imprint template having at least three gratings and the substrate having at least three gratings positioned such that each imprint template grating forms a composite grating with an associated substrate grating, the at least three imprint template gratings and associated substrate gratings having offsets relative to one another, the method comprising: detecting an intensity of radiation which is reflected by the three composite gratings; and using the detected intensities to determine displacement of the substrate or imprint template from a position.

According to an aspect of the invention, there is provided a lithographic apparatus comprising: an imprint template holder configured to hold an imprint template; a substrate table configured to hold a substrate to be imprinted by the imprint template; an alignment radiation beam source and a beam directing apparatus, arranged to direct an alignment radiation beam towards different locations on the imprint template; and a detector arranged to detect an intensity of alignment radiation reflected from gratings provided on the imprint template and the substrate.

BRIEF DESCRIPTION OF THE DRAWINGS

Specific embodiments of the invention will be described with reference to the accompanying figures, in which.

DETAILED DESCRIPTION

Figure 1A:
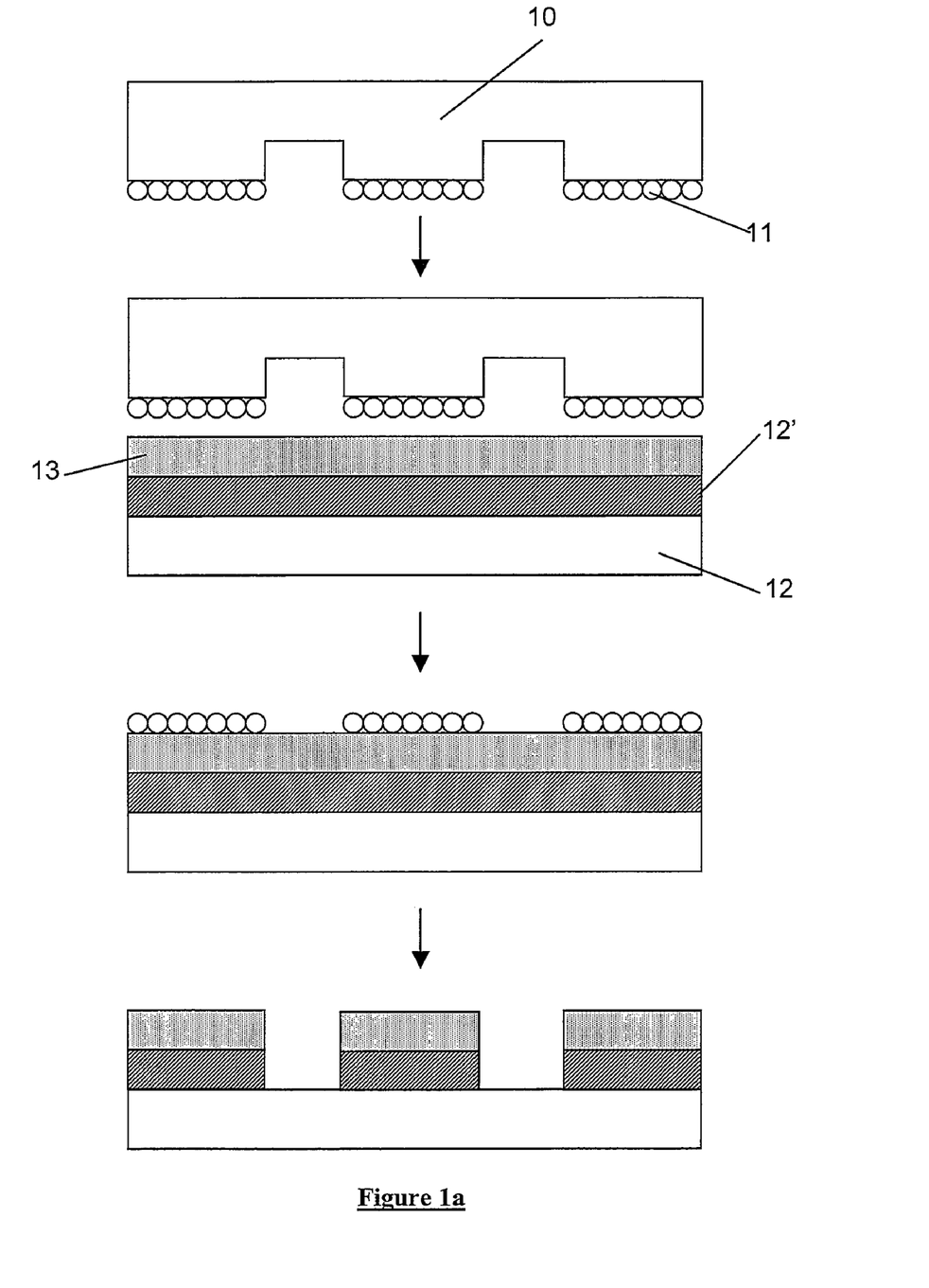
FIGS. 1a-c schematically shows examples of, respectively, micro-contact printing, hot imprint, and ultraviolet (UV) radiation imprint.
Figure 1B:
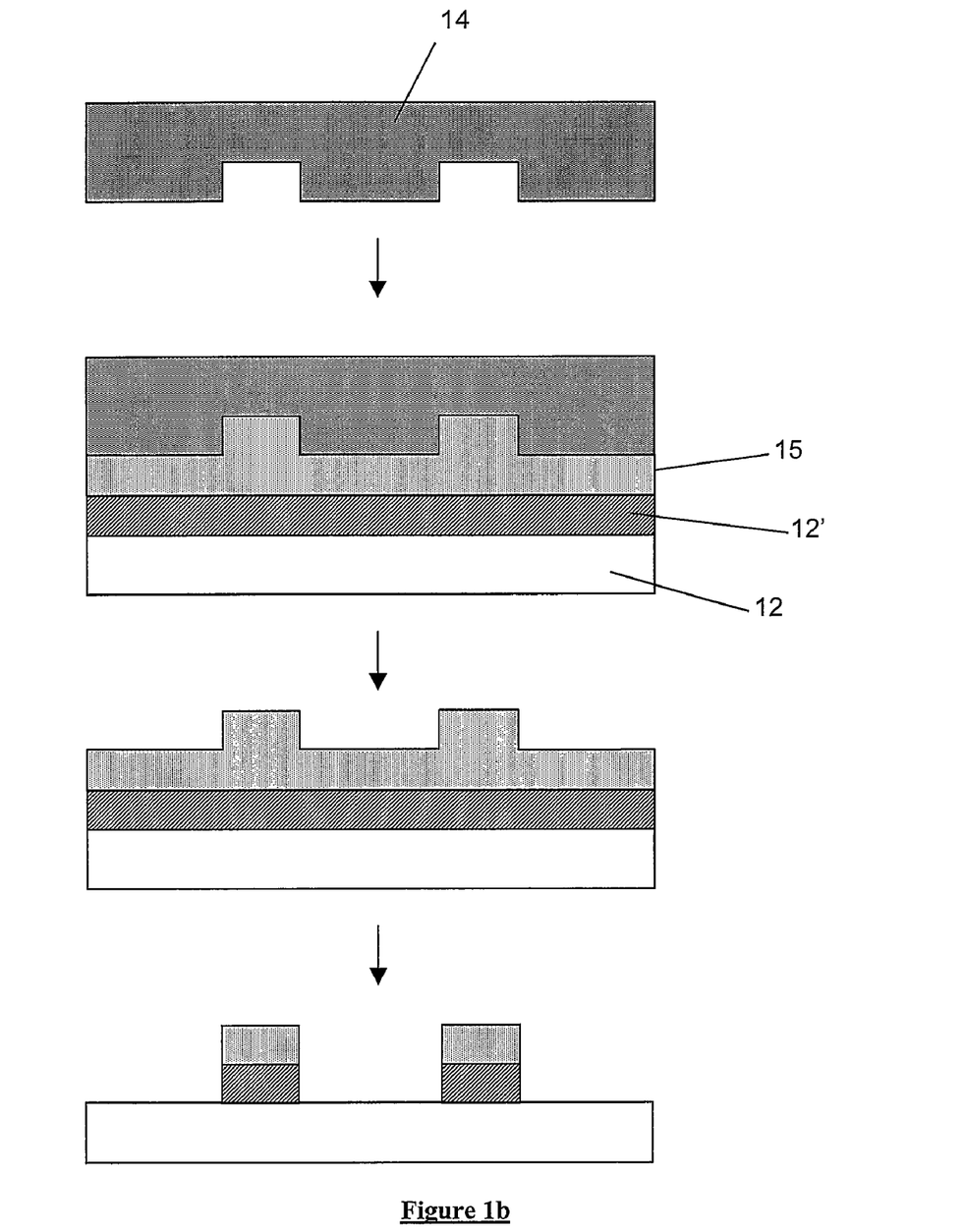
Figure 1C:
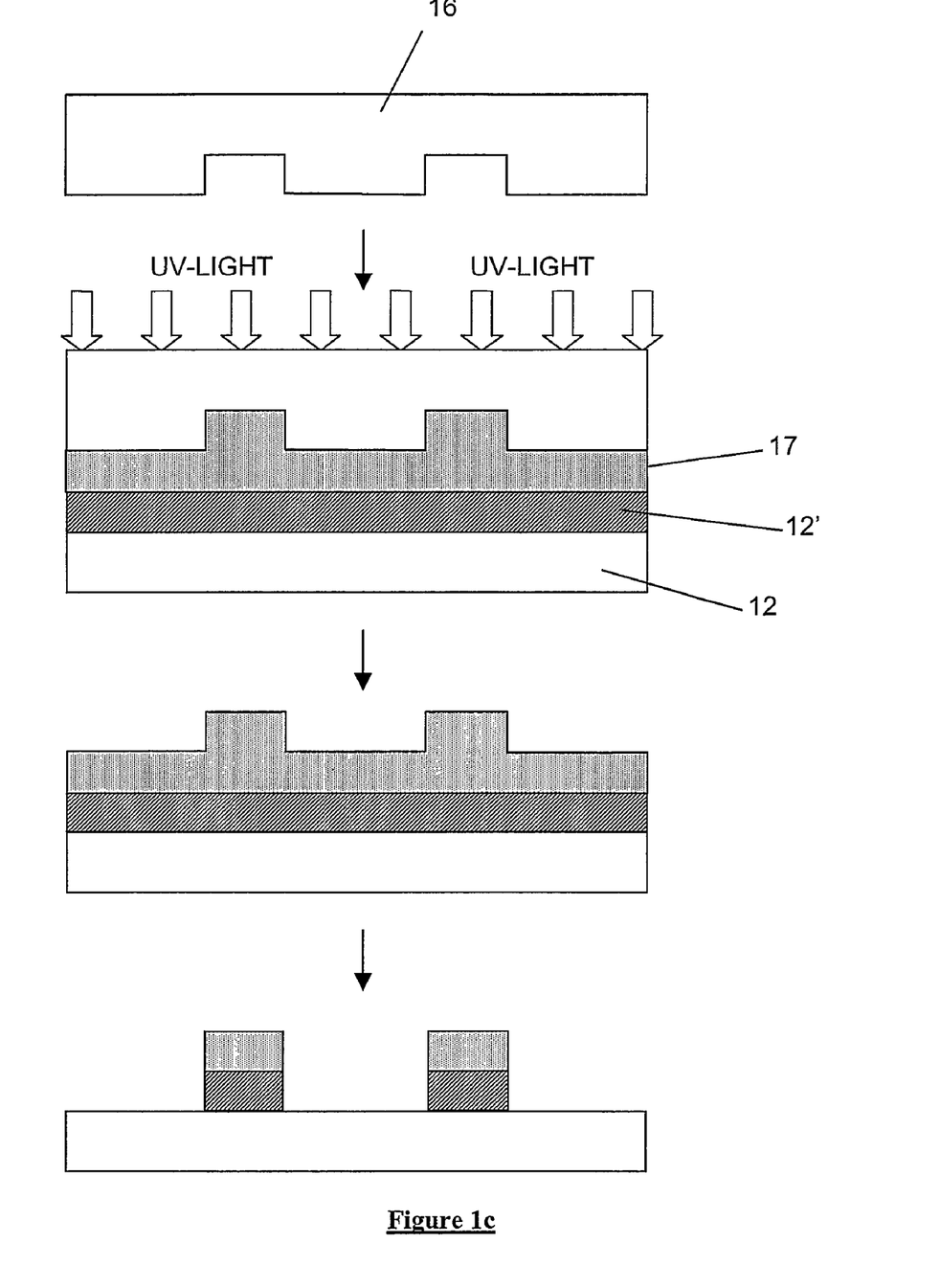

Examples of three known approaches to imprint lithography are schematically depicted in FIGS. 1a to 1c.

FIG. 1a shows an example of a type of imprint lithography that is often referred to as micro-contact printing. Micro-contact printing involves transferring a layer of molecules 11 (typically an ink such as a thiol) from a template 10 (e.g. a polydimethylsiloxane template) onto an imprintable medium layer 13 which is supported by a substrate 12 and planarization and transfer layer 12'. The template 10 has a pattern of features on its surface, the molecular layer being disposed upon the features. When the template is pressed against the imprintable medium layer, the layer of molecules 11 are transferred onto the imprintable medium. After removal of the template, the imprintable medium is etched such that the areas of the imprintable medium not covered by the transferred molecular layer are etched down to the substrate. For more information on micro-contact printing, see e.g. U.S. Pat. No. 6,180,239.

FIG. 1b shows an example of so-called hot imprint lithography (or hot embossing). In a typical hot imprint process, a template 14 is imprinted into a thermosetting or a thermoplastic imprintable medium 15 which has been cast on the surface of a substrate 12. The imprintable medium may, for example, be resin. The imprintable medium may, for instance, be spin coated and baked onto the substrate surface or, as in the example illustrated, onto a planarization and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template may then be removed and the patterned resin cooled. In hot imprint lithography employing a layer of thermoplastic polymer resin, the thermoplastic resin is heated so that it is in a freely flowable state immediately prior to imprinting with the template. It may be necessary to heat a thermoplastic resin to a temperature considerably above the glass transition temperature of the resin. The template is pressed into the flowable resin and then cooled to below its glass transition temperature with the template in place to harden the pattern. Thereafter, the template is removed. The pattern will consist of the features in relief from a residual layer of the resin which residual layer may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1c shows an example of UV radiation imprint lithography, which involves the use of a transparent template and a UV radiation-curable liquid as imprintable medium (the term "UV" is used here for convenience but should be interpreted as including any suitable actinic radiation for curing the imprintable medium). UV radiation curable liquids are often less viscous than the thermosetting and thermoplastic resins used in hot imprint lithography and consequently may move much faster to fill template pattern features. A quartz template 16 is applied to a UV radiation-curable resin 17 on substrate 12 (and optionally on a planarization and transfer layer 12') in a similar manner to the process of FIG. 1b. However, instead of using heat or temperature cycling as in hot imprint, the pattern is frozen by curing the imprintable medium with UV radiation that is applied through the quartz template onto the imprintable medium. Thereafter, the template is removed. The pattern will consist of the features in relief from a residual layer of the resin which residual layer may then be removed by an appropriate etch process to leave only the pattern features. A particular manner of patterning a substrate through UV radiation imprint lithography is so-called step and flash imprint lithography (SFIL), which may be used to pattern a substrate in small steps in a similar manner to optical steppers conventionally used in integrated circuit (IC) manufacture. For more information on UV radiation imprint, see e.g. U.S. patent application Publication No. US 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. patent application Publication No. US 2005-0274693, which mentions a combination of heating and UV radiation curing an imprintable medium.

Figure 2A:
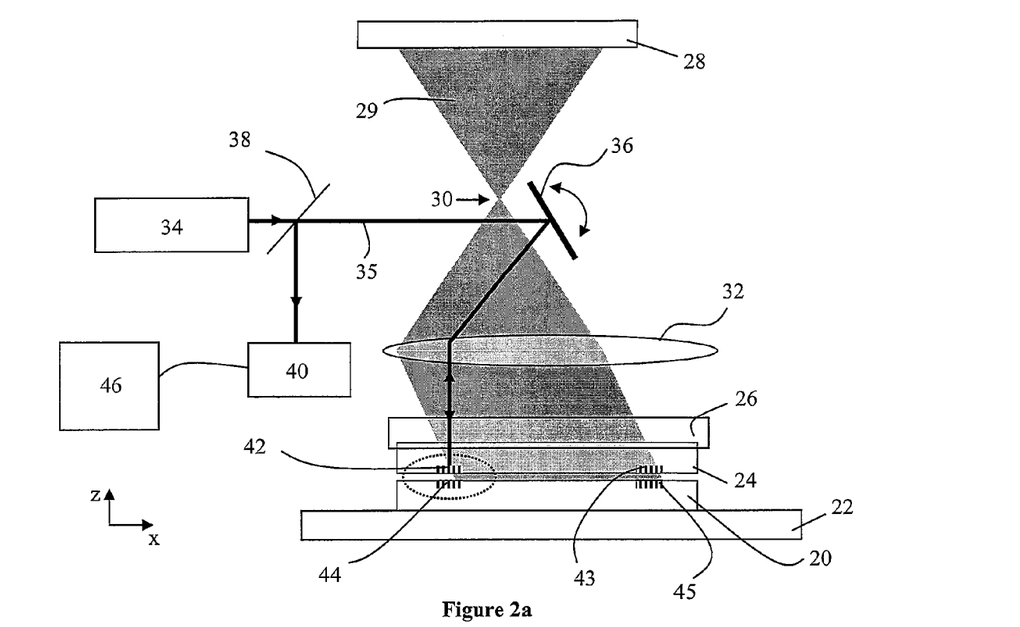
FIG. 2 schematically shows a lithographic apparatus according to an embodiment of the invention.

FIG. 2 shows schematically an imprint lithography apparatus according to an embodiment of the invention. Referring to FIG. 2a, a substrate 20 bearing a layer of imprintable medium is provided on a substrate table 22. An imprint template 24 is held by an imprint template holder 26. A source of actinic radiation 28 (for example, a UV radiation source) is provided above the imprint template holder 26. The radiation source 28 is configured to provide a converging beam of actinic radiation 29 which passes through a focal area or focal point 30 (focal area if the actinic radiation source 28 is an extended source; focal point if the actinic radiation source 28 is a point source). A lens 32, which is located some distance beyond the focal point 30 is arranged to collimate the actinic radiation beam 29, and to direct it through the imprint template holder 26 and imprint template 24 onto the substrate 20.

The lithographic apparatus further comprises a source 34 of non-actinic radiation. This source, which will hereafter be referred to as the alignment beam source 34, generates a collimated beam of radiation 35 which will hereafter be referred to as the alignment radiation beam. A tip-tilt mirror 36 is provided above the imprint template holder 26. The tip-tilt mirror 36 can be tilted around two axes, and is arranged to be moved between a plurality of orientations. Different orientations of the rotatable mirror 36 may direct the alignment radiation beam towards different alignment targets 42, 43 provided on the imprint template 24 (or towards different parts of those alignment targets). The axes about which the tip-tilt mirror 36 may be tilted may, for example, be parallel and normal to the surface of the substrate table 22.

The lithographic apparatus further comprises a beam-splitter 38 and detector 40. The beam-splitter 38 is arranged to direct towards the detector 40 a portion of the alignment radiation beam 35 which has been reflected from the substrate 20 or from the imprint template 24, as is explained below. The detector 40 is connected to a processor 46, which receives output from the detector and uses this output to align the substrate 20 with respect to the imprint template 24 (or to align the imprint template with respect to the substrate).

The actinic radiation beam 29 passes through the focal point or focal area 30 in order to allow the tip-tilt mirror 36 to be provided above the imprint template holder 26 without the actinic radiation beam 29 hitting the tip-tilt mirror. Other arrangements of the actinic radiation and the tip-tilt mirror 36 may be used. For example, the tip-tilt mirror may be provided in some other location, and/or a beam-directing apparatus other than a tip-tilt mirror may be used to direct the alignment radiation beam towards the imprint template. For example, a lens system, mirror array or other optical device may be used. The actinic radiation source may be provided in a different location, with the actinic radiation beam being directed to the imprint template, for example, by beam steering mirrors.

During alignment, the actinic radiation source 28 is switched off (or the actinic radiation beam is blocked) such that the actinic radiation beam 29 is not directed onto the imprint template 24 or substrate 20. A substrate 20 which has been provided with a layer of imprintable medium is then placed on the substrate table 22. The substrate table is moved until the substrate is positioned beneath the imprint template 24, the imprint template alignment marks 42, 43 being located over alignment targets 44, 45 provided on the substrate. The imprint template 24 may be brought into contact with the imprintable medium provided on the substrate 20. The substrate table 22 may be moved, for example, by motors. The position of the substrate table may be monitored, for example, by one or more interferometers, as is described further below.

The accuracy with which the substrate table is positioned in this initial alignment phase (sometimes referred to as coarse alignment) is such that the imprint template alignment marks 42, 43 and substrate alignment marks 44, 45 are aligned sufficiently closely to allow alignment (sometimes referred to as fine alignment) to be performed using the marks 42-45. Once final alignment has taken place, the imprint template holder 26 is lowered (and/or the substrate table is raised) so that the imprintable medium flows into pattern recesses of the imprint template 24. The actinic radiation beam 29 is then directed onto the imprintable medium in order to cure the imprintable medium (and thereby cause it to solidify). The imprint template 24 and substrate 20 are then separated, and the substrate 20 is removed from the lithographic apparatus for processing.

Alignment between the substrate 20 and the imprint template 24 is achieved as follows. The tip-tilt mirror 36 is oriented such that it directs the alignment radiation beam 35 towards part of a first imprint template alignment target 42. A proportion of the alignment radiation beam 35 will be reflected from the imprint template alignment target 42, and a proportion of the alignment radiation beam will pass onto the substrate alignment target 44. A proportion of the alignment radiation beam 35 will then be reflected from the substrate alignment target 44. The reflected alignment radiation (i.e. alignment radiation which has been reflected from the imprint template alignment target 42 and/or the substrate alignment target 44) passes back to the mirror 36. The mirror 36 directs the reflected alignment radiation towards the beam-splitter, which in turn directs the reflected alignment radiation onto the detector 40. The detector provides an output signal which passes to the processor 46.

The tip-tilt mirror 36 is then moved to a new orientation (not shown) such that it directs the alignment radiation beam 35 towards a different part of the first imprint template alignment target 42, and the detector 40 again provides an output signal which passes to the processor 46. This may be repeated for other different parts of the first imprint template alignment target 42.

Figure 2B:
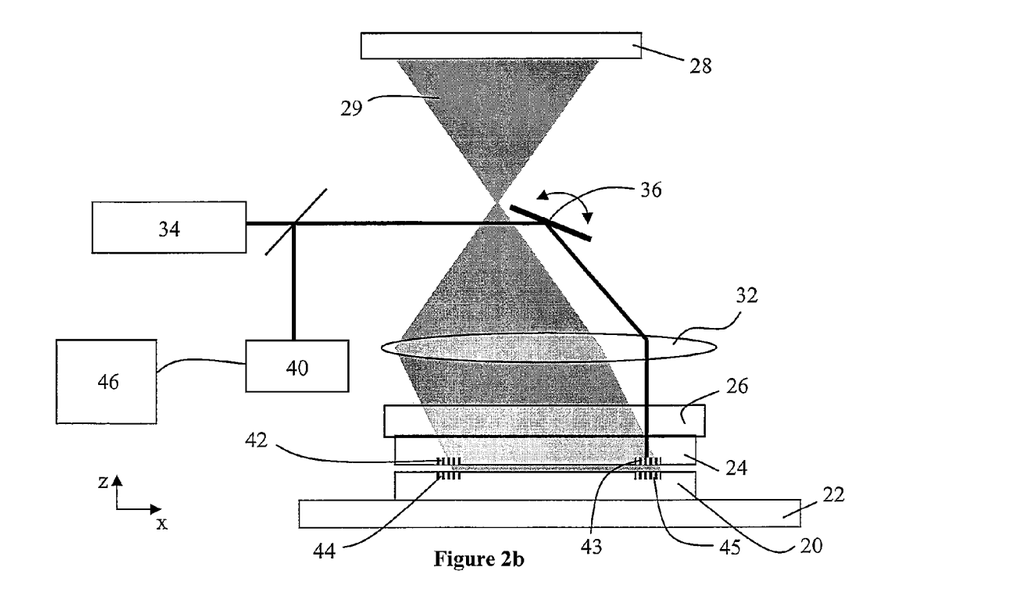

Referring to FIG. 2b, the tip-tilt mirror 36 is then moved to a new orientation, such that the alignment radiation beam 35 is directed towards part of a second imprint template alignment target 43 and associated substrate alignment target 45. Again, a portion of the alignment radiation beam 35 is reflected back via the mirror 36 and beam-splitter 38 to the detector 40. The detector 40 again provides an output signal which passes to the processor 46.

The tip-tilt mirror 36 is then moved to other orientations in order to direct the alignment radiation beam 35 towards other parts of the second imprint template alignment target 43.

The tip-tilt mirror 36 may be moved to other orientations in order to direct the alignment radiation beam 35 towards other imprint template alignment targets (not shown).

The processor 46 uses the signals output from the detector 40 to determine the distance of the substrate 20 (and/or the template 24) from a desired aligned position. The desired aligned position may, for example, be the position in which a pattern provided on the imprint template 24 is aligned with a pattern provided on the substrate 20. The processor then causes movement of the substrate table 22 until the substrate 20 (and/or of the imprint template holder 26 until the imprint template 24) is in the desired aligned position.

The manner in which the imprint template alignment targets 42, 43 and the substrate alignment targets 44, 45 provide a signal which may be used to align the substrate 20 with respect to the imprint template 24 (or vice versa) is illustrated schematically in FIG. 3.

Figure 3A:
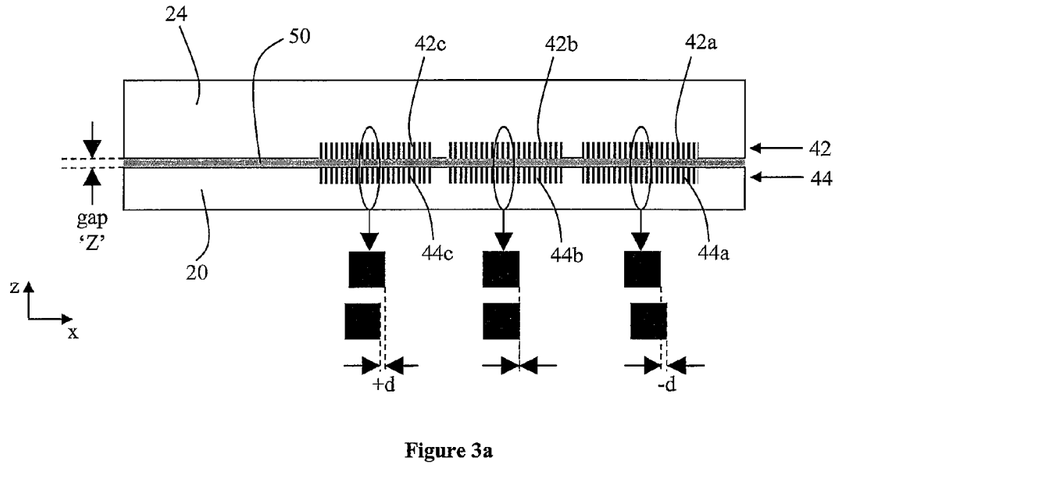
FIG. 3 schematically shows alignment of an imprint template and substrate according to an embodiment of the invention.

FIG. 3a shows in more detail a portion of the imprint template 24 and substrate 20 that is circled by a dotted line in FIG. 2a. As can be seen from FIG. 3a, the first imprint template alignment target 42 comprises at least three gratings 42a-c provided on a lowermost surface of the imprint template 24. The associated substrate alignment target 44 also comprises at least three gratings 44a-c, provided on an uppermost surface of the substrate 20. A layer of imprintable medium 50 is provided between the imprint template 24 and the substrate 20.

The period of each grating 42a-c, 44a-c is the smile. However, the substrate gratings 44a-c are offset relative to the imprint template gratings 42a-c. In the example shown in FIG. 3a, for ease of understanding the imprint template 24 and substrate 20 are aligned so that the central imprint grating 42b and the central substrate grating 44b are aligned. The offset of the right-hand substrate grating 44a relative to the right-hand imprint template grating 42a is a distance "−d". The offset of the left-hand substrate grating 44c relative to the left-hand imprint template grating 42c is a distance "+d".

Figure 3B:
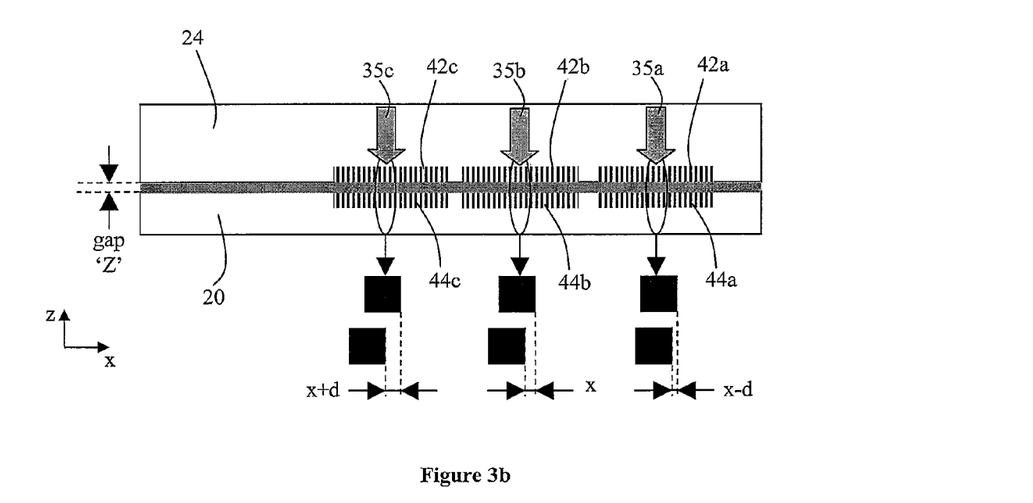

Operation of an embodiment of the invention is described in relation to FIG. 3b. Coarse alignment between the substrate 20 and the imprint template 24 is performed as described further above. As a result of this coarse alignment, the imprint template gratings 42a-c are located over the substrate gratings 44a-c. However, they are not aligned as shown in FIG. 3a, but instead include a degree of misalignment.

The tip-tilt mirror 36 is used to direct the alignment radiation beam 35 towards the imprint template alignment target 42. The alignment radiation beam 35 does not illuminate the entire alignment target 42, but instead illuminates each of the imprint template gratings 42a-c in turn.

The alignment radiation beam 35 is initially directed at the right-hand imprint template alignment mark 42a (the alignment radiation beam is labeled here as 35a). The cross-sectional size (e.g., diameter or width) of the alignment radiation beam 35a is sufficiently small, relative to the size of the imprint template grating 42a, that the alignment radiation beam 35a does not extend beyond edges of the grating. The imprint template grating 42a and the substrate grating 44a (as well as imprint template grating 42b and substrate grating 44b and imprint template grating 42c and substrate grating 44c) may together be considered to form a composite grating. This composite grating reflects a proportion of the alignment radiation beam 35a back to the detector (see FIG. 2a). The reflected alignment radiation may be considered to have undergone a zero-order diffraction which has reflected the alignment radiation. The detector 40 detects only zero-order alignment radiation. It does not detect a significant amount of $1^{st}$ order or higher order diffracted radiation.

The term composite grating may be interpreted as meaning two gratings which are configured such that a substantial proportion of radiation diffracted by one of the gratings is incident upon the other grating. The amount of radiation which is reflected by the composite grating depends upon the degree to which the respective imprint template grating and substrate grating are aligned. The pitch of the gratings may be of the same order as the wavelength of the alignment radiation beam, and as a result the physics which governs the reflection of radiation by the composite grating is complicated. In order to aid an intuitive understanding, the following is a simplified explanation based on geometrical optics.

Reflective lines of the substrate grating 44a, 44b and/or 44c will reflect radiation upwards to the detector 40, in addition to reflective lines of the respective imprint template grating 42a, 42b, and/or 42c. The amount of radiation which is reflected by the substrate grating 44a, 44b and/or 44c and respective imprint template grating 42a, 42b, and/or 42c will depend upon the extent to which the substrate grating 44a, 44b and/or 44c is aligned with the respective imprint template grating 42a, 42b, and/or 42c. If the imprint template grating 42a, 42b, and/or 42c and the respective substrate grating 44a, 44b and/or 44c are positioned such that lines of the substrate grating 44a, 44b and/or 44c are located directly beneath lines of the respective imprint template grating 42a, 42b, and/or 42c, then little of the alignment radiation beam 35a will be reflected from the substrate grating 44a, 44b and/or 44c. This is because the alignment radiation which passes between reflective lines of the imprint template grating 42a, 42b, and/or 42c will not be incident upon reflective lines of the respective substrate grating 44a, 44b and/or 44c, but will instead pass between those lines without a significant proportion of the radiation being reflected. At the opposite extreme, if the substrate grating 44a, 44b and/or 44c were to be positioned such that it was out of phase with the respective imprint template grating 42a, 42b, and/or 42c (i.e. such that lines of the substrate grating 44a, 44b and/or 44c lie beneath gaps of the respective imprint template grating 42a, 42b, and/or 42c), then alignment radiation which passed between lines of the imprint template grating 42a, 42b, and/or 42c would be incident upon lines of the respective substrate grating 44a, 44b and/or 44c. A substantial amount of alignment radiation would therefore be reflected by the substrate grating 44a, 44b and/or 44c.

The physics which governs the reflection of alignment radiation by the composite grating formed by the imprint template grating 42a, 42b, and/or 42c and the respective substrate grating 44a, 44b and/or 44c is more complex than that described above. However, the effect is the same— namely that the amount of radiation which is incident upon the detector 40 depends upon the extent to which the substrate grating 44a, 44b and/or 44c is aligned with the respective imprint template grating 42a, 42b, and/or 42c.

FIG. 3b shows a situation in which the substrate 20 has been positioned too far to the left (i.e. too far in the negative x-direction) relative to the imprint template 24. In this instance, the intensity of reflected alignment radiation detected by the detector 40 (see FIG. 2) from the left-hand imprint template grating 42c in combination with the left-hand substrate grating 44c is greater than the intensity detected from the central imprint template grating 42b in combination with the central substrate grating 44b. The intensity of reflected alignment radiation detected by the detector 40 from the central imprint template grating 42b in combination with the central substrate grating 44b is greater than the intensity detected from the right-hand imprint template grating 42a in combination with the right-hand substrate grating 44a.

The tip-tilt mirror 36 is used to direct the alignment radiation beam 35 at each of the imprint template gratings 42a-c in turn. This is represented in FIG. 3b by three arrows 35a-c. The intensity of radiation reflected by the gratings is detected each time by the detector 40.

The intensity of radiation incident upon the detector 40, which may be thought of as a zero-order reflected intensity (reflected from gratings), may vary quadratically as a function of displacement in the x-direction. This may be represented as:

$$I = I_0 + Kx^2 \quad \text{(Equation 1)}$$

Applying this to each of the three grating pairs shown in FIG. 3 results in the following:

$$I_a = I_0 + K(x-d)^2$$

$$I_b = I_0 + Kx^2$$

$$I_c = I_0 + K(x-d)^2 \quad \text{(Equation 2)}$$

where $I_0$ and K are constants, d represents the offset of the substrate gratings relative to the imprint template gratings, and x is the misalignment between the substrate and the imprint template.

Equation 2 may be used to determine the misalignment x between the substrate and the imprint template. Taking the difference between $I_c$ and $I_a$ yields:

$$I_c - I_a = 4Kxd \quad \text{(Equation 3)}$$

Taking the average of $I_c$ and $I_a$ and adding $I_b$ to this average yields:

$$I_a + I_c - 2I_b = 2Kd^2 \quad \text{(Equation 4)}$$

Finally, k may be eliminated from the equations in order to obtain:

$$x = \left(\frac{d}{2}\right) \frac{I_c - I_a}{I_c + I_a - 2I_b} \quad \text{(Equation 5)}$$

By using an algorithm based on Equation 5, the processor 46 may process the intensity values output from the detector 40 in order to determine the misalignment x between the substrate 20 and the imprint template 24. Once the misalignment x has been determined, the substrate table 22 may be moved to align the substrate 20 to the imprint template 24 (i.e. to remove or reduce the misalignment). Alternatively or additionally; the imprint template holder 26 may be moved to align the imprint template 24 to the substrate 20.

Once the substrate 20 has been aligned to the imprint template 24, the imprint template is pressed down towards the substrate 20, causing the imprintable medium 50 to flow into recesses of a pattern provided on the imprint template. The actinic radiation source 28 is then switched on (or the actinic radiation beam 29 is unblocked), and the beam of actinic radiation is directed onto the imprintable medium 50. The imprintable medium solidifies, thereby retaining the pattern imprinted by the imprint template 24. The imprint template 24 and the substrate 20 are then separated, for example by moving the substrate table 22 downwards and away from the imprint template, or by moving the imprint template holder 26 upwards and away from the substrate. The substrate 22 is then removed from the substrate table 22, and another substrate is placed on the substrate table. The alignment and imprint process is then repeated.

Equations 1 to 5 provide an indication of why the offsets +d, −d of the substrate gratings 44a, 44b and/or 44c are useful. The offsets help to ensure that the intensity of alignment radiation reflected by each of the gratings provides useful information. If no offsets were to be present, then each combination of substrate and imprint template alignment grating would provide the same information, and there would not be sufficient information available to determine the misalignment of the substrate and imprint template.

Although the illustrated offsets are provided in the substrate gratings 44a-c, they may additionally or alternatively be provided in the imprint template gratings 42a-c. Indeed, since the offset are relative offsets between the substrate and imprint template gratings, a positive offset of the substrate gratings could be considered to be equivalent to a negative offset of the imprint template gratings.

Although the illustrated offsets comprise two equal and opposite offsets and a zero offset (−d, +d and 0), other offsets may be used. Three different offsets should be used, since there are three unknown parameters: the alignment error, the average value of the reflected alignment radiation ($I_0$), and the curvature of the parabola defined in Equation 1 (K). The offsets may have any suitable values. One of the offsets may be zero (zero is considered to be an offset in this context).

The alignment radiation beam 35 may, for example, be a laser beam (for example a mono-chromatic beam), or alternatively white light or some other broadband radiation generated by an extended source. The alignment radiation beam 35 may, for example, have a wavelength of 632 nm, and may, for example, be generated by a helium-neon laser.

The gratings may, for example, measure 40×40 □m. The gratings may be any other suitable size. However, as mentioned above, the gratings should be sufficiently large, relative to the cross-section of the alignment radiation beam, that the alignment radiation beam does not extend beyond edges of the gratings.

The substrate grating 44a, 44b and/or 44c may be partially reflective. The imprint template grating 42a, 42b, and/or 42c may be partially reflective.

The imprint template grating 42a, 42b, and/or 42c and the substrate grating 44a, 44b and/or 44c should have a pitch which is sufficiently large to allow non-zero diffraction orders to propagate between the gratings (the term 'non-zero diffraction orders' in this context refers to diffraction orders other than the zero order). If the pitch were to be too small then non-zero diffraction orders formed by the imprint template grating 42a, 42b, and/or 42c would fall outside of the respective substrate grating 44a, 44b and/or 44c. If the alignment radiation beam 35 were to have a wavelength of 632 nm, then the pitch of the gratings may, for example, be 300 nm or greater.

The pitch of the imprint template grating 42a, 42b, and/or 42c and the substrate grating 44a, 44b and/or 44c may be sufficiently small, relative to the cross-sectional size of the respective alignment radiation beam 35a, 35b, and/or 35c (referred to hereafter as the measurement spot diameter), that at least 20 grating lines fall within the diameter of the measurement spot. The measurement spot may, for example, have a diameter of 20-30 microns. If this were to be the case, then the maximum pitch of the gratings would be around 1.5 microns.

A gap 'Z' is labeled in FIG. 3 between a lowermost surface of the imprint template 24 and an uppermost surface of the substrate 20. The gap Z is filled with the imprintable medium 50. The size of the gap Z may be such that alignment radiation transmitted by the imprint template grating 42a, 42b, and/or 42c starts diverging, but the diverging alignment radiation falls completely on the respective substrate grating 44a, 44b and/or 44c. In general, the gap may be dictated by aspects of imprint lithography such as the amount of imprintable medium 50 which is present. Typically the gap is rarely more than 1-2 microns, but it may be several microns.

The detector 40 may include a wavelength discriminating apparatus, which may, for example, have a spectral resolution of 10 or more. The wavelength discriminating apparatus may be used, for example, when the alignment radiation source 34 is a broadband radiation source. The wavelength discriminating apparatus, such as a filter, is useful because the variation of reflected alignment radiation as a function of the gap Z is wavelength dependent. If the alignment radiation source 34 is a narrow-band radiation source such as a helium-neon laser, then the detector 40 may, for example, be a photodiode without a wavelength discriminating apparatus.

The initial alignment (coarse alignment) between the substrate and the imprint template should be within the capture range provided by the targets 42, 44. The term 'capture range' is intended to mean the range of misalignments of the substrate and/or template from the aligned position over which alignment can be achieved using the gratings. The capture range of an embodiment of the invention is less than the pitch of the gratings. The capture range is approximately a quarter of the pitch of the gratings of targets 42, 44. This link between the capture range and the grating pitch may influence the grating pitch which is used. A smaller grating pitch will require a higher accuracy of coarse alignment, in order to ensure that the coarse alignment aligns the gratings within the capture range.

Although an embodiment of the invention has been described with the alignment radiation beam 35 being directed sequentially at each of the imprint template gratings 42a-c in turn, an embodiment of the invention may direct the alignment radiation beam at each of the imprint template gratings at the same time. This may be done, for example, by splitting the alignment radiation beam into three separate beams that simultaneously illuminate the three imprint template gratings 42a-c. Three detectors could be used to simultaneously measure the reflected alignment radiation. In an embodiment, any number of separate alignment beams and detectors may be used. Any number of tip-tilt mirrors or other beam-directing apparatuses may be used.

The imprint template may be an imprint template which is sufficiently large to imprint an entire substrate in one go (e.g. as shown in FIG. 2). Where this is the case, the imprint template may be provided with a multiplicity of patterns each of which may form a separate device.

Alternatively, the imprint template may imprint part of the substrate. Where this is the case, the imprint template is then removed from the imprinted part of the substrate and is used to imprint a different part of the substrate. This is repeated until all desired parts of the substrate have been imprinted. Alignment targets (comprising alignment gratings) may be provided at a multiplicity of locations on the substrate, in order to allow the imprint template to be aligned to each part of the substrate as required.

The alignment targets described herein may comprise gratings which extend in the x-direction, and therefore provide alignment between the substrate and the imprint template in the x-direction. Alignment targets which comprise alignment gratings extending in the y-direction may alternatively or additionally be provided to obtain alignment between the substrate and the imprint template in the y-direction.

Although only two imprint template alignment targets 42, 43 are shown in the illustrated embodiment, any number of imprint template alignment targets may be provided. For example, two imprint template alignment targets which enable alignment in the x-direction and two which enable alignment in the y-direction may be provided (this may be a useful number of alignment targets to provide alignment of the imprint template and the substrate). Three, four or more imprint template alignment targets which enable alignment in the x-direction and three, four or more which enable alignment in the y-direction may be provided.

In the described embodiment, alignment is achieved by moving the substrate table 20 in the x and y directions. However, it is possible to move the imprint template 24 in the x and y directions to achieve alignment. This may be done instead of, or as well as, movement of the substrate table 20 in the x and y directions. In general terms, it may be that there is relative movement between the substrate and the imprint template.

An advantage of embodiment of the invention is that it does not require that the gratings are scanned relative to one another in order to obtain an alignment signal (as is the case with a phase-grating alignment based system).

A further advantage of an embodiment of the invention is that it does not require an imaging detector, but instead may rely upon intensity detection (an intensity detector is generally cheaper than an imaging detector).

The above described embodiment of the invention may be used for alignment between an imprint template 24 and a substrate 20, as described above. In some instances, it may be desirable to monitor the alignment between the imprint template 24 and the substrate 20 over a period of time. For example, exposure of the imprintable medium 50 to the actinic radiation beam 29 may take place for several seconds, in order to ensure that the imprintable medium is cured and hence solidified. It may be desirable to monitor the alignment between the imprint template 24 and the substrate 20 during this period, and to minimize or reduce deviation from the aligned position during the period.

The embodiment of the invention described above may have a relatively slow speed of response (for example 0.1 seconds or slower), and may therefore not be capable of measuring and compensating for alignment deviations which occur more rapidly than this. An alignment apparatus which may have a faster response speed, and which may therefore be capable of measuring and compensating for such alignment deviations is shown in FIG. 4.

Figure 4:
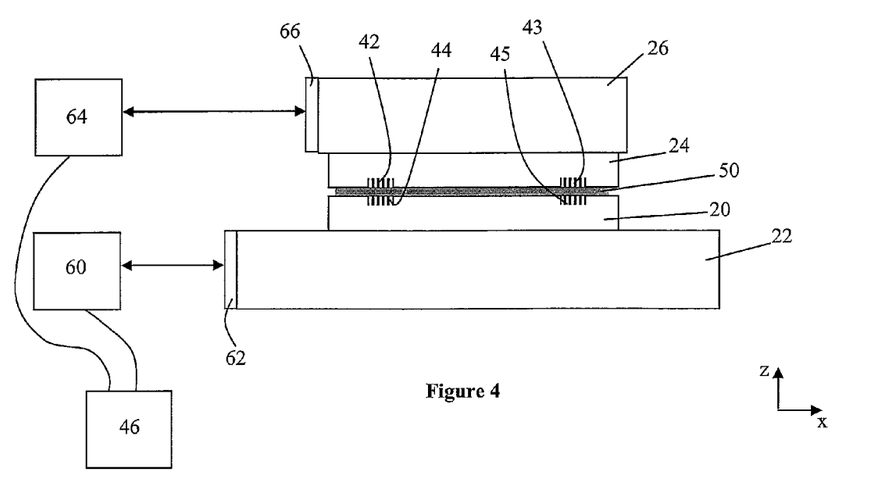
FIG. 4 schematically shows other parts of the lithographic apparatus according to an embodiment of the invention.

FIG. 4 shows part of an imprint lithography apparatus. Many of the features shown in FIG. 4 correspond with features shown in FIG. 2. Where this is the case, the features are provided with common reference numerals and are not described in detail here.

In FIG. 4, a substrate 20 is held on a substrate table 22, and an imprint template 24 is held by a template holder 26. Alignment targets 42, 43 are provided on the imprint template, and are positioned over corresponding alignment targets 44, 45 provided on the substrate 20. Imprintable medium 50 is provided between the imprint template 24 and the substrate 20.

The apparatus of FIG. 4 further comprises an interferometer 60 which is arranged to direct a beam of coherent radiation towards a mirror 62 provided on a side of the substrate table 22. This interferometer will hereafter be referred to as the substrate table interferometer 60. The apparatus further comprises an interferometer 64 which is arranged to direct a radiation beam at a mirror 66 provided on a side of the imprint template holder 26. This interferometer will hereafter be referred to as the imprint template holder interferometer 64. Outputs from the interferometers 60, 64 pass to the processor 46 (the same processor which receives signals output from the detector 40 shown in FIG. 2).

The interferometers 60, 64 are capable of measuring the positions of the substrate table 22 and the imprint template holder 26 respectively with a high accuracy, which may, for example, be of the order of a few nanometers. The interferometers may have a faster speed of response than the alignment apparatus described above in relation to FIGS. 2 and 3. The interferometers may, for example, have a bandwidth of the order of kilohertz.

The substrate 20 may be securely fixed to the substrate table 22. This may for example be achieved by applying a vacuum to a lowermost surface of the substrate 20 through the substrate table 22. Since the substrate 20 is securely fixed to the substrate table 22, when the interferometer 60 detects movement of the substrate table 22, the substrate 20 will also have undergone the same movement. Thus, movement of the substrate 20 may be monitored using the substrate table interferometer 60.

The imprint template 24 is securely held by the template holder 26. Thus, movement of the imprint template 24 may be monitored using the imprint template holder interferometer 64.

The detector 40 (see FIG. 2) and the interferometers 60, 64 may be rigidly held such that they do not move relative to one another (to within tolerances required to achieve a satisfactory alignment). For example, the detector 40 and interferometers 60, 64 may be mounted on a frame of the lithographic apparatus (sometimes referred to as a metrology frame).

During alignment, an aligned position between the substrate 20 and the imprint template 24 may be determined using the alignment targets 42-45 and the detector 40. The respective positions of the substrate table 22 and imprint template holder 26 for this aligned position may be measured using the interferometers 60, 64. Subsequent deviation of the substrate table 20 or imprint template holder 26 away from the aligned position may be measured by the interferometers 60, 64 and corrected for by the processor. This may allow correction for deviations from the aligned position which may, for example, arise due to heating, mechanical disturbances, or other factors.

The interferometers 60, 64 may be used to reduce or minimize deviation of the substrate 20 and/or imprint template 24 away from the aligned position during removal of the imprint template from the substrate (i.e. after the imprintable medium 50 has been cured).

Although the detector 40 and interferometers 60, 64 have been described as being held on the same frame, they may be held on different frames. Where this is the case, an interferometer may be used to monitor relative movement between the frames.

Figure 5:
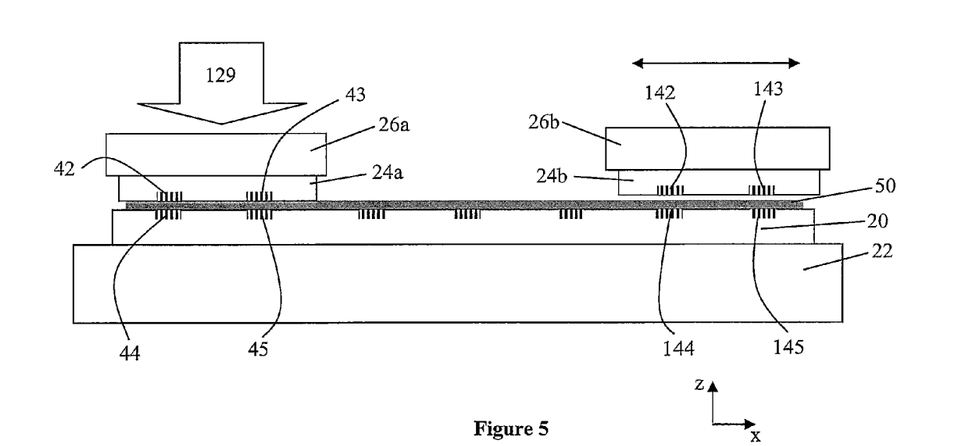
FIG. 5 schematically shows an alternative lithographic apparatus to which an embodiment of the invention may be applied.

A further imprint lithography apparatus to which an embodiment of the invention may be applied is shown schematically in FIG. 5. A substrate 20 is held on a substrate table 22, and is provided with a layer of imprintable medium 50. The substrate 20 has been provided with a plurality of alignment targets 44, 45, 144, 145 (other alignment targets are present but not labeled). A first imprint template holder 26a holds a first imprint template 24a, and a second imprint template holder 26b holds a second imprint template 24b. Each of the imprint template holders 26a, 26b is independently moveable both in the Z direction, and optionally independently moveable in a plane which is parallel to the surface of the substrate table 22. Each imprint template 24a, 24b is provided with a plurality of alignment targets 42, 43, 142, 143.

The first and second imprint templates 24a, 24b are independently moved to or onto different locations on the substrate 20, and are used to imprint a pattern onto the substrate in a manner described further above. The first and second imprint templates 24a, 24b are smaller than the substrate 20, and thus multiple imprints by the imprint templates are needed in order to imprint patterns over the surface of the substrate.

In some instances it may be desirable to align the second imprint template 24b with respect to the substrate 20 while the first imprint template 24a is already aligned and is imprinting a pattern into the imprintable medium 50 (or vice versa). This is represented in FIG. 5 by an arrow showing actinic radiation 129 being directed through the first imprint template 24a onto the substrate, and a double-headed arrow showing movement of the second imprint template 24b in the x-direction. When this is the case, it may be desirable not to move the substrate table 22 during alignment of the second imprint template 24b.

In a conventional phase grating based alignment system it may not be possible to imprint with a first imprint template 24a while aligning a second imprint template 24b. This is because movement of the substrate table 22 may be needed in order to generate a phase grating alignment signal. Instead of using a phase grating alignment system, the alignment system described further above in relation to FIGS. 2 and 3 may be used. This alignment system does not require movement of the substrate 22 in order to determine alignment, and therefore allows the second imprint template 24b to be aligned to the substrate 20 without moving the substrate 20.

The alignment system therefore allows alignment between the second imprint template 24b and the substrate 20 while the first imprint template 24a is imprinting a pattern into imprintable medium 50 provided on the substrate. This allows the imprint templates 24a, 24b to be moved independently of one another, thereby allowing flexibility in the routing of the imprint templates over the substrate 20, and thus facilitating improved throughput of the imprint lithography apparatus.

The alignment system is not shown in FIGS. 4 and 5 in order to avoid making FIGS. 4 and 5 overly complex. However, the manner in which the alignment system could be provided for the imprint apparatus of FIGS. 4 and 5 are straightforward. For example, in the case of FIG. 5, elements of the alignment system such as the tip-tilt mirror 36 (see FIG. 2) may be provided separately for each of the imprint templates 24a, 24b and the detector 40 may be provided separately for each of the imprint templates, or may be used in common for more than one imprint template.

As described further above, the alignment system described in relation to FIGS. 2 and 3 does not require an imaging detector, but may instead use an intensity detector (for example, a photodiode). In a multi-template imprint lithography system, where a separate alignment system is provided for each imprint template, it may be desirable to minimize the cost of the alignment system where possible. The use of an intensity detector rather than an imaging detector for the alignment system provides a reduction of the cost of the alignment system. This reduction of cost may be significant when two or more imprint templates are provided in the lithographic apparatus. Although two imprint templates are shown in FIG. 5, any number of imprint templates (and corresponding alignment systems) may be used. The greater the number of imprint templates, the greater the cost saving provided by using an intensity detector rather than an imaging detector. Of course, an imaging detector based alignment system may used in combination with the alignment system described herein. For example, one template may have an imaging detector based alignment system and another template may have the alignment system described herein.

Although described embodiments of the invention, use UV radiation imprint lithography, an embodiment of the invention may use another form of imprint lithography such as hot imprint lithography.

The invention claimed is:

1. A method of determining a position of a substrate relative to an imprint template, the imprint template having at least three gratings and the substrate having at least three gratings positioned such that each imprint template grating forms a composite grating with an associated substrate grating, the at least three imprint template gratings and associated substrate gratings having offsets relative to one another, the method comprising:
    detecting an intensity of radiation which is reflected by the three composite gratings; and
    using the detected intensities to determine displacement of the substrate or imprint template from a position.

2. The method of claim 1, wherein the at least three gratings all extend in the same direction.

3. The method of claim 2, wherein the imprint template has at least three additional gratings and the substrate has at least three additional gratings, and the at least three additional gratings extend in a direction which is transverse to the at least three gratings.

4. The method of claim 1, wherein one of the offsets is a zero offset, and the other two offsets are non-zero offsets of different values.

5. The method of claim 1, wherein an alignment radiation beam is directed towards a given grating, and the intensity of radiation reflected by that grating is detected before the alignment radiation beam is directed towards a different grating.

6. The method of claim 5, wherein the alignment radiation beam is directed towards the gratings using a tip-tilt mirror.

7. The method of claim 1, wherein an alignment radiation beam is directed towards a plurality of gratings at the same time, and the intensity of radiation reflected by different gratings is detected by different detectors.

8. The method of claim 1, wherein the imprint template gratings are larger than the cross-sectional size of an alignment radiation beam.

9. The method of claim 1, wherein the pitch of the gratings is sufficiently small relative to the cross-sectional size of an alignment radiation beam that at least 20 grating lines fall within the cross-sectional size of the alignment radiation beam.

10. The method of claim 1, wherein the pitch of the gratings, the size of the gratings and the separation of the gratings is such that a non-zero diffraction order of an alignment radiation beam is incident upon the substrate gratings.

11. The method of claim 1, further comprising moving the substrate or imprint template until they are in a certain position, measuring a position of a substrate table and imprint template holder using an interferometer when the substrate and imprint template are in the certain position, and then subsequently measuring and correcting for deviations of the substrate table and imprint template holder from the certain position.

12. The method of claim 1, wherein determining the position of the substrate relative to the imprint template takes place during exposure of an imprintable medium present on the substrate to an actinic radiation beam.

13. The method of claim 1, wherein the imprint template is one of a plurality of independently moveable imprint templates and the method further comprises determining a position of an imprint template of the plurality of imprint templates while another imprint template of the plurality of imprint templates is imprinting a pattern.

14. A lithographic apparatus, comprising:
    an imprint template holder configured to hold an imprint template;
    a substrate table configured to hold a substrate to be imprinted by the imprint template;
    an alignment radiation beam source and a beam directing apparatus, arranged to direct an alignment radiation beam towards different locations on the imprint template; and
    a detector arranged to detect an intensity of alignment radiation reflected from at least three gratings provided on the imprint template and the substrate.

15. The lithographic apparatus of claim 14, further comprising a processor configured to receive signals from the detector, and to determine a position for the imprint template and the substrate using the received signals.

16. The lithographic apparatus of claim 14, wherein the beam directing apparatus comprises a tip-tilt mirror.

17. The lithographic apparatus of claim 14, comprising a plurality of detectors arranged to simultaneously detect intensity of alignment radiation reflected by different gratings.

18. The lithographic apparatus of claim 14, further comprising an interferometer arranged to monitor a position of the imprint template holder and the substrate table.

19. The lithographic apparatus of claim 14, further comprising:
    a processor configured to receive signals from the detector, and to determine a position for the imprint template and the substrate using the received signals; and
    an interferometer arranged to monitor a position of the imprint template holder and the substrate table,
    wherein the processor is configured to receive signals from the detector and from the interferometer, and to determine a position for the imprint template and the substrate using the received signals from the detector and from the interferometer.

20. The lithographic apparatus of claim 14, wherein the imprint template holder is one of a plurality of independently moveable imprint template holders, and the apparatus comprises a separate beam directing apparatus for each of the imprint template holders.

* * * * *